United States Patent
Clifton et al.

(10) Patent No.: US 9,620,611 B1
(45) Date of Patent: Apr. 11, 2017

(54) MIS CONTACT STRUCTURE WITH METAL OXIDE CONDUCTOR

(71) Applicant: Acorn Technologies, Inc., La Jolla, CA (US)

(72) Inventors: Paul A. Clifton, Redwood City, CA (US); Andreas Goebel, Mountain View, CA (US)

(73) Assignee: ACORN TECHNOLOGY, INC., La Jolla, CA (US)

( * ) Notice: Subject to any disclaimer, the term of this patent is extended or adjusted under 35 U.S.C. 154(b) by 0 days.

(21) Appl. No.: 15/186,378

(22) Filed: Jun. 17, 2016

(51) Int. Cl.
H01L 29/36 (2006.01)
H01L 29/49 (2006.01)
H01L 29/51 (2006.01)
H01L 29/16 (2006.01)

(52) U.S. Cl.
CPC .......... *H01L 29/4966* (2013.01); *H01L 29/16* (2013.01); *H01L 29/36* (2013.01); *H01L 29/517* (2013.01)

(58) Field of Classification Search
CPC ... H01L 29/4966; H01L 29/16; H01L 29/517; H01L 29/36
See application file for complete search history.

(56) References Cited

U.S. PATENT DOCUMENTS

| | | |
|---|---|---|
| 3,513,366 A | 5/1970 | Clark |
| 3,590,471 A | 7/1971 | Lepselter et al. |
| 3,708,360 A | 1/1973 | Wakefield, Jr.; et al. |

(Continued)

FOREIGN PATENT DOCUMENTS

| | | |
|---|---|---|
| EP | 0295490 A1 | 12/1988 |
| EP | 0789388 A2 | 8/1997 |

(Continued)

OTHER PUBLICATIONS

"Patents Act 1977: Examination Report under Section 18(3)", UK Intellectual Property Office dated Apr. 29, 2015, Application No. GB1409999.8 (filed Oct. 18, 2012), 5 pgs.

(Continued)

*Primary Examiner* — Kyoung Lee
(74) *Attorney, Agent, or Firm* — Ascenda Law Group, PC (57) ABSTRACT

An electrical contact structure (an MIS contact) includes one or more conductors (M-Layer), a semiconductor (S-Layer), and an interfacial dielectric layer (I-Layer) of less than 4 nm thickness disposed between and in contact with both the M-Layer and the S-Layer. The I-Layer is an oxide of a metal or a semiconductor. The conductor of the M-Layer that is adjacent to and in direct contact with the I-Layer is a metal oxide that is electrically conductive, chemically stable and unreactive at its interface with the I-Layer at temperatures up to 450° C. The electrical contact structure has a specific contact resistivity of less than or equal to approximately $10^{-5}$-$10^{-7}$ $\Omega$-cm$^2$ when the doping in the semiconductor adjacent the MIS contact is greater than approximately $2 \times 10^{19}$ cm$^{-3}$ and less than approximately $10^{-8}$ $\Omega$-cm$^2$ when the doping in the semiconductor adjacent the MIS contact is greater than approximately $10^{20}$ cm$^{-3}$.

19 Claims, 3 Drawing Sheets

(56) References Cited

U.S. PATENT DOCUMENTS

| | | | |
|---|---|---|---|
| 3,983,264 A | 9/1976 | Schroen et al. |
| 4,019,113 A | 4/1977 | Hartman |
| 4,056,642 A | 11/1977 | Saxena et al. |
| 4,300,152 A | 11/1981 | Lepselter |
| 4,422,090 A | 12/1983 | Shepherd et al. |
| 4,485,550 A | 12/1984 | Koeneke et al. |
| 4,583,110 A | 4/1986 | Jackson et al. |
| 4,723,197 A | 2/1988 | Takiar et al. |
| 4,811,077 A | 3/1989 | Fowler et al. |
| 4,843,029 A | 6/1989 | Joyce et al. |
| 5,021,365 A | 6/1991 | Krichner et al. |
| 5,027,166 A | 6/1991 | Ohtsuka et al. |
| 5,098,859 A | 3/1992 | Jackson et al. |
| 5,308,998 A | 5/1994 | Yamazaki et al. |
| 5,399,206 A | 3/1995 | De Lyon |
| 5,438,210 A | 8/1995 | Worley |
| 5,578,848 A | 11/1996 | Kwong et al. |
| 5,596,218 A | 1/1997 | Soleimani et al. |
| 5,608,266 A | 3/1997 | Agnello et al. |
| 5,612,567 A | 3/1997 | Baliga |
| 5,663,584 A | 9/1997 | Welch |
| 5,801,398 A | 9/1998 | Hebiguchi |
| 5,801,444 A | 9/1998 | Aboelfotoh et al. |
| 5,888,891 A | 3/1999 | Gould |
| 5,908,313 A | 6/1999 | Chau et al. |
| 5,939,763 A | 8/1999 | Hao et al. |
| 5,943,575 A | 8/1999 | Chung et al. |
| 6,011,271 A | 1/2000 | Sakkuma et al. |
| 6,037,605 A | 3/2000 | Yoshimura |
| 6,064,082 A | 5/2000 | Kawai et al. |
| 6,071,783 A | 6/2000 | Liang et al. |
| 6,091,076 A | 7/2000 | Deleonibus et al. |
| 6,096,590 A | 8/2000 | Chan et al. |
| 6,117,781 A | 9/2000 | Lukanc et al. |
| 6,150,286 A | 11/2000 | Sun et al. |
| 6,198,113 B1 | 3/2001 | Grupp |
| 6,207,976 B1 | 3/2001 | Takahashi et al. |
| 6,261,932 B1 | 7/2001 | Hulfachor |
| 6,291,282 B1 | 9/2001 | Wilk et al. |
| 6,291,866 B1 | 9/2001 | Wallace et al. |
| 6,291,867 B1 | 9/2001 | Wallace et al. |
| 6,293,137 B1 | 9/2001 | Liu et al. |
| 6,303,479 B1 | 10/2001 | Snyder |
| 6,326,294 B1 | 12/2001 | Jang et al. |
| 6,339,232 B1 | 1/2002 | Takagi |
| 6,344,673 B1 | 2/2002 | Aussilhou |
| 6,380,021 B1 | 4/2002 | Wang et al. |
| 6,452,244 B1 | 9/2002 | Miura et al. |
| 6,462,931 B1 | 10/2002 | Tang et al. |
| 6,548,875 B2 | 4/2003 | Nishiyama |
| 6,608,352 B1 | 8/2003 | Long et al. |
| 6,680,224 B2 | 1/2004 | Shin et al. |
| 6,724,068 B2 | 4/2004 | Matsuyama |
| 6,724,088 B1 | 4/2004 | Jammy et al. |
| 6,833,556 B2 | 12/2004 | Grupp et al. |
| 6,891,234 B1 | 5/2005 | Connelly et al. |
| 7,084,423 B2 | 8/2006 | Grupp et al. |
| 7,112,478 B2 | 9/2006 | Grupp et al. |
| 7,176,483 B2 | 2/2007 | Grupp et al. |
| 7,382,021 B2 | 6/2008 | Faulkner et al. |
| 7,462,860 B2 | 12/2008 | Grupp et al. |
| 7,816,240 B2 | 10/2010 | Faulkner et al. |
| 7,883,980 B2 | 2/2011 | Grupp et al. |
| 7,884,003 B2 | 2/2011 | Grupp et al. |
| 8,110,877 B2 | 2/2012 | Mukherjee et al. |
| 8,377,767 B2 | 2/2013 | Grupp et al. |
| 8,431,469 B2 | 4/2013 | Grupp et al. |
| 8,647,960 B2 | 2/2014 | Deweerd et al. |
| 8,658,523 B2 | 2/2014 | Faulkner et al. |
| 8,766,336 B2 | 7/2014 | Grupp et al. |
| 8,916,437 B2 | 12/2014 | Grupp et al. |
| 8,952,541 B2 | 2/2015 | Mukherjee et al. |
| 9,209,261 B2 | 12/2015 | Grupp et al. |
| 9,362,376 B2 | 6/2016 | Harrison et al. |
| 2001/0028067 A1 | 10/2001 | Awano |
| 2002/0061646 A1 | 5/2002 | Kan et al. |
| 2003/0009463 A1 | 1/2003 | Gallant |
| 2003/0012146 A1 | 1/2003 | Novaes |
| 2003/0121468 A1 | 7/2003 | Boone et al. |
| 2003/0127700 A1 | 7/2003 | Moddel et al. |
| 2003/0132466 A1 | 7/2003 | Shin et al. |
| 2003/0235936 A1 | 12/2003 | Snyder et al. |
| 2004/0026687 A1 | 2/2004 | Grupp et al. |
| 2004/0142524 A1 | 7/2004 | Grupp et al. |
| 2005/0009302 A1 | 1/2005 | Wakui et al. |
| 2005/0037557 A1 | 2/2005 | Doczy et al. |
| 2005/0093027 A1 | 5/2005 | Grupp et al. |
| 2011/0092047 A1 | 4/2011 | Gaines et al. |
| 2012/0280294 A1 | 11/2012 | Grupp et al. |
| 2014/0041722 A1* | 2/2014 | Liang ............... H01L 31/18 136/256 |
| 2014/0284666 A1 | 9/2014 | Grupp et al. |

FOREIGN PATENT DOCUMENTS

| | | |
|---|---|---|
| WO | WO 2004/015782 A1 | 2/2004 |
| WO | WO 2004/030104 A1 | 4/2004 |

OTHER PUBLICATIONS

"Research Achievements", Research Achievements at RCIQE, downloaded Apr. 12, 2002, from: http://www.rciqe.hokudai.ac.jp/RCIQEold/ResearchAchievements.html, 8 pgs.

Aberle, Armin G., et al., "Injection-Level Dependent Surface Recombination Velocities at the Silicon-Plasma Silicon Nitride Interface", Institute fur Solarenergieforschung, ISFH, D-3 1860 Emmerthal, Germany, (Mar. 9, 1995), pp. 2828-2830.

Aboelfotoh, "Influence of thin interfacial silicon oxide layers on the Schottky-barrier behavior of Ti on Si(100)", Phys Rev B Condens Matter (Mar. 1989), 39(8):5070-5078.

Acorn Technologies, Inc., International Application No. PCT/US2012/060893 filed Oct. 18, 2012, ISA/US, International Search Report and Written Opinion, Dec. 11, 2012, 23 pages.

Acorn Technologies, Inc., International Search Report and Written Opinion, PCT/US2005/030209 Mar. 2, 2006, 8 pp.

Adam; et al., "Experimental Identification of Nitrogen-Vacancy Complexes in Nitrogen Implanted Silicon", Applied Physics Letters (Jul. 2001), 79(5):623-625.

Agrawal; et al., "Fermi level depinning and contact resistivity reduction using a reduced titania interlayer in n-silicon metal-insulator-semiconductor ohmic contacts", Applied Physics Letters (2014), 104(11):112101-1-112101-4.

Alers; et al., "Effects of Thermal Stability and Roughness on Electrical Properties of Tantalus Oxide Gates", MRS Proceedings (1999), 567:391-395.

Almeida; et al., "Reaction-Diffusion Model for Thermal Growth of Silicon Nitrite Films on Si", Physical Review B (Dec. 2000), 62(24):R16255-R16258.

Bannikov; et al., "Field-Effect Transistor With Metal-(Tunneling-Insulator)-Semiconductor Contacts and a Gate Insulator Made of A Mangmuir-Blodgett Film", Soviet Technical Physics Letters (Mar. 1989), 15(3):211-212.

Bauernschmitt, et al., "Transition from MOS to Schottky-contract behaviour in Yb—SiO2—Si Tunneling Junctions with extremely thin SiO2 layer", Microelectronic Engineering (1993), 22:105-108.

Baumvol, "Atomic Transport During Growth of Ultrathin Dielectrics on Silicon", Surface Science Reports (Dec. 1999), 36(1-8):1-166.

Berger, "Contact Resistance and Contact Resistivity" J. Electrochem. Soc.: Solid-State Science and Technology (1972), 119(4):507-514.

Blosse; et al., "A Novel Low Cost 65nm CMOS Process Architecture With Self Aligned Isolation and W Cladded Source/Drain", IEEE, Transactions of 2004 International Electron Device Meeting (Jan. 2005), pp. 669-672.

Bringans, "Arsenic Passivation of Si and Ge Surfaces", Critical Reviews in Solid State and Materials Sciences I(1992), 17(4):353-395.

(56) References Cited

OTHER PUBLICATIONS

Cai; et al., "Investigation of the Properties of Plasma-Enhanced Chemical Vapor Deposition Silicon Nitrite and its Effect on Silicon Surface Passivation", Journal of Applied Physics (May 1998), 83(11):5885-5889.

Card; et al., "Studies of tunnel MOS diodes I. Interface effects in silicon Schottky diodes", Journal of Physics D: Applied Physics (1971), 4(10):1589-1601.

Chadi; et al., "Fermi-Level-Pinning Defects in Highly n-Doped Silicon", Physical Review Letters (Dec. 1997), 79(24):4834-4837.

Chaneliere; et al., "Tantalum Pentoxide (Ta2O5) Thin Films for Advanced Dielectric Applications"; Materials Science and Engineering, R: Reports (May 1998), 22(6):269-322.

Chen; et al., "High Quality Native-Oxide-Free Ultrathin Oxide Grown by In-Situ HF-Vapor Treatment", Electronic Letters, (May 2000), 36(11):981-983.

Connelly; et al., "Optimizing Schottky S/D Offset for 25-nm Dual-Gate CMOS Performance", Electron Device Letters, IEEE (Jun. 2003), 24(6)411-413.

Edelstein; et al., "Full Copper Wiring in a Sub-0.25 mm CMOS ULSI Technology", Proceedings of the IEEE International Electron Device Meeting (1997), pp. 773-776.

Gilmer; et al., "Process and Manufacturing Challenges for High-K Gate Stack Systems", MRS Proceedings, MRS Spring Meeting (1999), 567:323-341.

Gopalakrishnan; et al., "Impact Ionization MOS (I-MOS)—Part I: Device and Circuit Simulations", IEEE Transactions Electron Devices (Jan. 2005), 52(1):69-76.

Hara, et al., "Control of Schottky and Ohmic Interfaces by Unpinning Fermi Level", Applied Surface Science (1997), 117-118:394-399.

Hara; et al., "Pinning-Controlled Metal/Semiconductor Interfaces", Proc. SPIE 2779, 3rd International Conference on Intelligent Materials and 3rd European Conference on Smart Structures and Materials (Apr. 1996), 2779:802-807.

Hara; et al., "Pinning-Controlled Ohmic Contacts: Application to SiC(0001)", Applied Surface Science (Nov. 1996), 107:218-221.

Hasegawa; et al., "Unpinning of Fermi Level in Nanometer-Sized Schottky Contacts on GaAs and InP", Applied Surface Science (2000): 166:92-96.

Hayafuji; et al., "Nitridation of Silicon and Oxidized-Silicon", J. Electrochem. Soc. (1982), 129(9):2102-2108.

Heine, "Theory of Surface States", Physical Review (Jun. 1965), 138(6A):83-4.

Hilsenbeck; et al., "Aging Behavior of Algan HFETs With Advanced Ohmic and Schottky Contacts", Electronic letters (May 2000), 38(11):980-981.

Huang, "Metal-Oxide Semiconductor Field-Effect Transistors Using Schottky Barrier Drains", Electronics Letters (1797), 33(15):1341-1342.

Huang; et al., "Two-Dimensional Numerical Simulation of Schottky Barrier MOSFET with Channel Length to 10 nn", IEEE (Apr. 1998), pp. 842-848.

International Search Report, PCT/US03/25057, Mailing Date Dec. 18, 2003, 4 pgs.

International Search Report, PCT/US2004/042084, Mailing date Sep. 1, 2005, 4 pgs.

Izumi, "43 Hydrogen Termination: The Ideally Finished Silicon Surface", Ultraclean Surface Processing of Silicon Wafers (1998), pp. 559-565.

Kamins; et al., "Effect of Hydrogen on p-Type Epitaxial Silicon Sheet-Resistance Measurements", Electrochemical and Solid-State Letters (1998), 1(2):100-101.

Kamiyama; et al., "Ultrathin Tantalum Odise Capacitor DIELECTRIC Layers Fabricated Using Rapid Thermal Nitridation Prior to Low Pressure Chemical Vapor Deposition", J. Electrochem Soc. (1993), 140(6)1617.

Kaxiras, "Efthimios. Semiconductor-surface restoration by valence-mending adsorbates: Application to Si (100): S and Si (100): Se", Phys Rev B Condens Matter (Mar. 1991), 43(18):6824-6827.

Kedzierski; et al., "Extension and Source/Drain Design for High-Performance FinFET Devices", IEEE Trans. Electron Devices (Apr. 2003), 50(4):952-958.

Keller; et al., "Calculations of the barrier height and charge distribution of a metal-dielectric interface", Journal of Vacuum Science & Technology A: Vacuum, Surfaces, and Films (Jul. 1992), 10(4):775-780.

Kim; et al., "Metal-Dependent Fermi-Level Movement in the Metal/Sulfer-Passivated InGaP Contact", Journal of Vacuum Science & Technology A: Vacuum, Surfaces, and Films (1997), 15(3):1124-1128.

Kimura; et al., "A New Type of Schottky Tunnel Transistor", IEEE Electron Device Letters (Oct. 1994), 15(10): 412-414.

Lee; et al., "Electronic Property of Metallic Nanoclusters on Semiconductor Surfaces: Implications for Nanoelectronic Device Applications", Journal of Nanoparticle Research (Dec. 2000), 2(4):345-362.

Louie; et al., "Ionicity and the Theory of Schottky Barriers", Physical Review B (Feb. 1977), 15(4):2154-2162.

Majumdar; et al., "Statistical demonstration of silicide-like uniform and ultra-low specific contact resistivity using a metal/high-k/Si stack in a sidewall contact test structure", 2014 Symposium on VLSI Technology Digest of Technical Papers (Jun. 9-12, 2014), INSPEC Accession No. 14582372, 0743-1562, 2 pgs.

Mandelis; et al., "Evidence of a Surface Acceptor State in Undoped Semi-Insulating GaAs by Photothermal Radiometric Deep Level Transient Spectroscopy", Sociedad Mexicana de Ciencias de Superficies y de Vacio, (1999), 8:13-17.

Martel; et al., "Ambipolar Single-Wall Carbon Nanotube Transistors and Inverters", AIP Conference Proceedings (Mar. 2001). 591:543-547.

McKee; et al., "Physical Structure and Inversion Charge at a Semiconductor Interface With a Crystalline Oxide", Science (Jul. 2001), 293(5529):468-471.

McKinley; et al., "Control of Ge homojunction band offsets via ultrathin Ga—As dipole layers", Applied Surface Science (1992), 56-58(Part 2):762-765.

McKinley; et al., "Controlled modification of heterojunction band lineups by diffusive intralayers", Journal of Vacuum Science & Technology A Vacuum Surfaces and Films (May/Jun. 1990), 8(3):1917-21.

Miyawaki; et al., "Improvement of Aluminum-Si Contact Performance in Native-Oxide-Free Processing", IEEE Electron Device Letters (Oct. 1990), 11(10):448-450.

Nauka; et al., "Surface Photovoltage Measurement of Hydrogen-Treated Si Surfaces", Journal of Electrochemical Society (1999), 146(1):292-295.

Nishioka; et al., "Dielectric Characteristics of Fluorinated Ultradry SiO2", Appl. Phy. Letters (Mar. 1989), 54(12):1127-1129.

Okamoto; et al., "Near-Ohmic Contact of n-GaAs with GaS/GaAs Quaisi-Metal-Insulator-Semiconductor Structure", Jpn. J. Appl. Phys. (1998), 37:3248-3251.

Padovani, "Forward Voltage-Current Characteristics of Metal-Silicon Schottky Barriers", Journal of Applied Physics (1967), 38(2):891-892.

Park; et al., "Thermal stability of molybdenum-silicon nitride-silicon Schottky diodes", Journal of Applied Physics (Mar. 1991), 69(5):3149-3153.

Patel; et al., "Arsenic Atom Location on Passive Silicon (111) Surfaces", Physical Review B (Nov. 1987), 36(14):7715-17.

Porter; et al., "A Critical Review of Ohmic and Rectifying Contacts for Silicon Carbide", Material Science and Engineering: B (Nov. 1995), 34(2-3):83-105.

Ren; et al. "Metal I Silicon Schottky Barrier Lowering by RTCVD Interface Passivation" Electrochemical Society Proceedings (2000), 2000-9:161-166.

Ruzyllo; et al., "Semiconductor Glossary An Introduction to Semiconductor Terminology", Prosto Multimedia Publishing (2004), pp. 26.

Schmidt; et al., "Carrier Recombination at Silicon-Silicon Nitride Interfaces Fabricated by Plasma-Enhanced Chemical Vapor Deposition", Journal of Applied Physics (Apr. 1999), 85(7):3626-3633.

(56) References Cited

OTHER PUBLICATIONS

Shalish; et al., "Yellow Luminescence and Fermi Level Pinning in GaN Layers", Appl Phys Lett (Aug. 2000), 77(7):987-989.

Snyder; et al., "Experimental Investigation of a PtSi Source and Drain Field Emission Transistor", Appl Phys Lett (1995), 67:1420-1422.

Sobolewski; et al., "Properties of Ultrathin Thermal Nitrides in Silicon Schottky Barrier Structures", Applied Physics Letters, American Institute of Physics (1989), 54(7):638-640.

Sobolewski; et al., "Studies of barrier height mechanisms in metal-silicon nitride-silicon Schottky barrier diodes", Journal of Vacuum Science & Technology B (1989), 7:971-979.

Spicer; et al., "Unified Mechanism for Schottky-Barrier Formation and III-V Oxide Interface States", Physical Review Letters (Feb. 1980), 44(6):420-423.

Sze, "Metal-Semiconductor Contacts", Physics of Semiconductor Devices, John Wiley & Sons, (1981), pp. 245-311.

Tao; et al., "Removal of dangling bonds and surface states on silicon (001) with a monolayer of selenium", Applied Physics Letters (Mar. 2003), 82(10)1559-1561.

Tao; et al., "Suppression of silicon (001) surface reactivity using a valence-mending technique", Solid State Communications (Oct. 2004), 132(2):89-92.

Taubenblatt; et al., "Interface effects in titanium and hafnium Schottky barriers on silicon", Appl Phys Lett (May 1984), 44:895-897.

Teraji; et al., "Ohmic Contacts to n-Type 6H-SiC Without Post-Annealing", Material Research Society, MRS Spring Meeting (1996), 423:149-154.

Tersoff, "Schottky Barrier Heightsand the Continuum of Gap States", Physical Review Letters (Feb. 1984), 52(6):465-468.

Thanailakis; et al., "Transition-metal contacts to atomically clean silicon, Department of Electrical Engineering and Electronics", Journal of Physics C: Solid State Physics (1976), 9:337-343.

Thompson; et al., "A Logic Nanotechnology Featuring Strained-Silicon", IEEE Electron Device Letters (Apr. 2004),25(4):191-193.

Tung, "Electron Transport of Inhomogeneous Schottky Barriers", Appl Phys Letter (1991), 58(24):2821-2823.

Udeshi; et al., "Thermal stability of ohmic contacts between Ti and Sepassivated n-type Si(001)", J Appl Phys (2004), 95(8):4219-4222.

Uemoto, "Reduction of Ohmic Contact Resistance on N-Type 6H-SIC by Heavy Doping", Japanese Journal of Applied Physics (Jan. 1995), 34(Parts 2, No. 1A).

Verhaverbeke; et al., "Surface Characterization of Si After HF Treatments and its Influence in the Dielectric Breakdown of Thermal Oxides", MRS Proceedings (1992), 259:391-399.

Wang; et al., "High Barrier GaN Schottky Diodes: Pt/GaN and Pd/GaN", Appl. Phys. Letters (Feb. 1996), 68(9):1267-1270.

Wei; et al., "The Use of Selective Electroless Metal Deposition for Micron Size Contact Fill", IEEE International Electron Device Meeting Technical Digest (1988), pp. 446-449.

Weinberger; et al., "Surface Chemistry of HF Passivation Silicon: X-Ray Photoelectron and Ion Scattering Spectroscopy Results", J. Appl. Phys (Nov. 1986), 60(9):3232-34.

Widjaja; et al., "Ab Initlo Study and Decomposition of NH3 on Si(100)-(2x1)", J. Phy. Chem B, (2000), 104:2527-2533.

Wittmer; et al., "Ideal Schottky diodes on passivated silicon", Phys Rev Lett (Nov. 1992), 69(18):2701-2704.

Wolf; et al., "Spintronics: A Spin-Based Vision for the Future", Science (Nov. 2001), 294(5546):1488-95.

Wright; et al., "Hot-Electron Immunity of $SiO_2$ Dielectrics with Fluorine Incorporation", IEEE Electron Device Letters (1989), 10(8):347-348.

Yablonovitch; et al., "Unusually Low Surface-Recombination Velocity on Silicon and Germanium Surfaces", Physical Review Letters (Jul. 1986), 57(2):249-252.

Yagishita; et al., "High Performance Damascene Metal Gate MOSFET's for 0.1 mm Regime", IEEE Trans. Electron Devices (2000), 47(5):1028-1034.

Yang; et al., "The Effects of Interfacial Sub-Oxide Transition Regions and Monolayer Level Nitridation on Tunneling Currents in Silicon Devices", IEEE Electron Device Letters (2000), 21(2):76-78.

Yu, Hao, et al., "Thermal Stability Concern of Metal-Insulator-Semiconductor Contact—A Case Study of $Ti/TiO_2$/n-Si-Contact", IEEE Transactions on Electron Devices (2016), 6 pages.

Zhang; et al., "Schottky diodes of NiÕAu on n-GaN grown on sapphire and SiC substrates", Applied Physics Letters (Oct. 2001), 79(16):2567-69.

Zhu; et al., "Low-Resistance Ti/n-Type Si(100) Contacts by Monolayer Se Passivation", ECS Trans (2006), 2(2):401-409.

Zhu; et al., "Stability of Se passivation layers on Si(001) surfaces characterized by time-of-flight positron annihilation induced Auger electron spectroscopy", Journal of Applied Physics (2005), 97(10):103510-1103510-4.

\* cited by examiner

MIS CONTACT STRUCTURE WITH METAL OXIDE CONDUCTOR

FIELD OF THE INVENTION

The present invention relates to what are generally known in the art as metal-insulator-semiconductor (MIS) electrical contacts, and in particular, such contacts in which the "insulator" is an interfacial dielectric layer that is an oxide of a metal, an oxide of a semiconductor, or both, and the "metal" is a conductive metal oxide.

BACKGROUND

Metal-semiconductor contact resistivity is an important consideration in the fabrication of field effect transistors and becomes increasingly important as the dimensions of the contacts are scaled down and currently approach ten nanometers. MIS contacts are a relatively recent technological development, and may provide a contact resistivity that is lower than the resistivity of the equivalent direct metal-semiconductor contact between the same metal and semiconductor pair. As described in the Applicant's U.S. Pat. No. 7,084,423, incorporated herein by reference, a very thin, interfacial dielectric layer between the metal and semiconductor acts to reduce the Schottky barrier at the junction and at the same time has sufficient conductivity, despite being itself a dielectric with poor bulk electronic conduction, to provide a net improvement in the conductivity of the MIS junction.

SUMMARY OF THE INVENTION

Described herein is an electrical contact structure including a conductor; a semiconductor (e.g., a group IV semiconductor such as silicon, germanium, or an alloy mixture of silicon, germanium, carbon, or tin; a group IV compound semiconductor such as SiC; a III-V compound semiconductor; a II-VI compound semiconductor; a two-dimensional semiconductor such as graphene, phosphorene; or a transition metal dichalcogenide such as monolayer molybdenum disulfide; or carbon nanotubes); and an interfacial dielectric layer of less than 4 nm thickness disposed between and in contact with both the conductor and the semiconductor, wherein the conductor is a conductive metal oxide, and wherein the interfacial dielectric layer is an oxide of a metal, an oxide of a semiconductor, or a mixture of both. Although the term "metal" is often used in the literature (as in "metal-insulator-semiconductor" contact), herein, we adopt the term "conductor" when referring to the conductive metal oxide in order to emphasize this nature of the contact element. In various embodiments, the electrical contact structure has a specific contact resistivity of less than or equal to approximately $10^{-5}$-$10^{-7}$ $\Omega$-$cm^2$ when the doping in the semiconductor adjacent the MIS contact is greater than approximately $2\times10^{19}$ $cm^{-3}$ and less than approximately $10^{-8}$ $\Omega$-$cm^2$ when the doping in the semiconductor adjacent the MIS contact is greater than approximately $10^{20}$ $cm^{-3}$. In various embodiments the interfacial dielectric layer may be a material that is an insulator or a semiconductor in its bulk state. In some embodiments, the interfacial dielectric layer has a thickness in the range 0.2 nm to 4 nm, and may be one of: $TiO_2$, $SrTiO_3$, MgO, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, CoO, NiO, ZnO, $SiO_2$. The conductive metal oxide layer may, in some embodiments, have a thickness in the range 0.5 nm to 3 nm and may be one of: $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, TiO, $V_2O_3$, VO, $Fe_3O_4$, ZnO, InSnO or $CrO_2$. In some embodiments, the interfacial dielectric layer includes a separation layer (e.g., a further insulating oxide layer separating the conductor and the semiconductor). Preferably, the junction between the conductive metal oxide layer and the interfacial dielectric layer is chemically stable up to a temperature of 400° C. and more preferably, the junction between the conductive metal oxide layer and the interfacial dielectric layer is chemically stable up to a temperature of 450° C. For example, there is preferably no chemical reaction between the conductive metal oxide layer and the interfacial dielectric layer that substantially consumes the interfacial dielectric up to a temperature of 400° C. and more preferably no such chemical reaction up to a temperature of 450° C. Also, or alternatively, the contact resistivity of the device is preferably less than or equal to approximately $10^{-7}$ $\Omega$-$cm^2$ after the device is heated to a temperature of 400° C. More preferably, the contact resistivity of the device remains less than or equal to approximately $10^{-7}$ $\Omega$-$cm^2$ after the device is heated to a temperature of 450° C. In some embodiments, the conductive metal oxide layer of the electrical contact structure is contacted by a thin metal layer of a different metal, such as W, Ag, Al, Ta, Co, or Cr. Although examples of materials that may comprise the interfacial dielectric layer are specified herein, persons of ordinary skill in the art will appreciate that such materials may not have the precise stoichiometry of the examples. For instance, $TiO_2$ may more preferably be described as $TiO_x$, with x less than or equal to 2 but greater then 1.5. Similar non-stoichiometric variants of the metal oxides described herein, together with mixed metal oxides and mixtures of metal and silicon or germanium oxides should be understood to be within the scope of the present invention. In some cases, non-stochiometric and also doped variants of the metal oxides exhibit semiconducting or even conducting properties, even if their undoped stoichiometric variants are considered dielectrics.

BRIEF DESCRIPTION OF THE DRAWINGS

The present invention is illustrated by way of example, and not limitation, in the figures of the accompanying drawings, in which.

DETAILED DESCRIPTION

As noted above, an MIS stack formed by a very thin, interfacial dielectric layer (termed herein an "I-Layer") between a metal oxide conductor (or "M-Layer") and a semiconductor (or "S-Layer") (e.g., silicon, germanium, silicon carbide, or germanium tin) has sufficient conductivity, despite the dielectric itself having poor conductivity in its bulk state, to provide a net improvement in the conductivity (over that which would exist in the absence of the I-Layer) of the junction of which it is a constituent. To enable a favorable result with a lowering of the contact resistivity, it is necessary for the interfacial dielectric layer, which might normally be an insulating or semiconducting material in its bulk state, to be very thin—of the order of one nanometer—to enable a large current density to flow, for example by quantum mechanical tunneling.

For the specific purpose of forming improved contacts to n-type semiconducting materials, in which the current is carried by transport of electrons between the conductor and semiconductor, it may be preferred to use an interfacial dielectric layer that itself presents only a small energy barrier to electrons. An example of such a material is titanium dioxide, which is found to present only a very small barrier to electron flow between a metal and an n-type semiconductor, such as Si or Ge, of the order of zero to 0.15 electron volts. In general, with favorable band alignment, the dielectric metal-oxide thickness can be as much as 5 nm or even 10 nm.

Whilst MIS contacts with a titanium oxide interface layer have been demonstrated to be effective in reducing contact resistivity for a broad range of combinations of metals and semiconductors, a problem may arise when MIS contacts are integrated into the industrial manufacture of semiconductor devices in integrated circuits ("ICs"). Metal-semiconductor contacts are processed at what is known as the middle of line (MOL), which is the stage in integrated circuit manufacturing that occurs after transistor fabrication (front end of line, FEOL) and before the processing of metal interconnect layers (back end of line, BEOL). As a consequence the metal contacts are exposed to the processing temperatures or "thermal budget" of the processes that occur during the BEOL, including any annealing or sintering process steps that may be applied as part of the BEOL. In the current state of the art of semiconductor integrated circuit manufacturing, it is typical for the BEOL to involve exposure of the contacts to a temperature of around 400° C. over a period of approximately two hours. Such a thermal budget may cause serious degradation of the MIS contact properties, including returning the contact resistivity to a high level more consistent with a direct metal-semiconductor contact. The degradation is due most likely to a chemical reduction of the critical thin interface layer if it is an oxide (e.g., titanium oxide). Most metals have an affinity for oxygen, i.e., there is a chemical driving force to form a metal oxide when the metal is in the presence of oxygen, especially at elevated temperatures. As such, most metals when placed in contact with a metal oxide such as titanium dioxide ($TiO_2$) and heated will remove oxygen from the titanium dioxide, rapidly reducing the $TiO_2$ to a sub-stoichiometric titanium oxide and, upon continued heating thereafter, to what amounts to titanium metal with a high concentration of residual oxygen. We find experimentally, for example, that MIS contacts in which the metal is titanium, the interface layer is titanium oxide and the semiconductor is silicon rapidly degrade to titanium-silicon contacts when heated to 400° C. for as little as 30 seconds. The low Schottky barrier to n-type semiconductor and the corresponding low contact resistivity provided by the MIS structure is lost as a result of the thermal degradation of the interface layer.

We find therefore that there is a need to form an MIS contact structure of low contact resistivity that also has sufficient thermal stability to be useful in an IC manufacturing process. The present invention involves using a metal oxide as the conductive metallic layer (the M-Layer) in the MIS structure and using a different metal oxide or an oxide of a silicon or germanium as an I-Layer. The I-Layer generally comprises a material that would be an insulator or a semiconductor in its bulk state, and may include a separation layer (e.g., a further insulating layer separating the conductor and the semiconductor).

Although most metal oxides tend to be electrically insulating dielectrics, there are a number of metal oxides that exhibit electrically conductive or metallic properties. Examples of electrically conducting metal oxides (which may be suitable as conductive metal layers (M-Layers) in the present MIS structure) include but are not limited to $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, $TiO$, $V_2O_3$, $VO$, $NbO$, $Fe_3O_4$, conducting $ZnO$, $InSnO$ and $CrO_2$. Examples of insulating metal oxides that may be used as an I-Layer in the present MIS structure include but are not limited to $TiO_2$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $SrTiO_3$ or $(Ba,Sr)TiO_3$, non-conducting $ZnO$, $MnO$, silicon oxide or germanium oxide. It may be noted that some metal oxides may exhibit a metal-insulator transition as a result of a change in temperature or pressure. For example the class of metal compounds known as Mott-Hubbard insulators, including the transition metal oxides $NiO$, $Ti_2O_3$, $V_2O_3$, $Cr_2O_3$, are insulating at low temperatures and conducting at high temperatures. Considering $V_2O_3$, this material makes an insulator-metal transition at a temperature of about 145 K at atmospheric pressure and makes an insulator-metal transition at a pressure of about 7 kilobar at "room temperature", i.e., approximately 300 K. For the purposes of the present invention we are concerned with the electrical conductivity of metal oxides in the normal range of temperature and pressure experienced by MIS contacts during the normal operation of semiconductor integrated circuits—temperature typically in the range 0° C. to 125° C. and pressure close to atmospheric pressure. Non-stoichiometric variants of the metal oxides described herein, together with mixed metal oxides and mixtures of metal and silicon or germanium oxides should be understood to be within the scope of the present invention. In some cases, non-stochiometric and also doped variants of the metal oxides exhibit semiconducting or even conducting properties, even if their undoped stoichiometric variants are considered dielectrics.

The application of a metal oxide as a conducting or metallic layer is known in the art of metal-insulator-metal (MIM) capacitor fabrication—for example, in the manufacture of dynamic random access memory (DRAM) devices—wherein a charge storage capacitor is required to have a high specific capacitance and also to have sufficient thermal stability to survive BEOL processing. For example, U.S. Pat. No. 5,619,393, incorporated herein by reference, discloses a high-dielectric-constant material layer is formed between a lower thin unreactive film on a lower electrode base, and an upper thin unreactive film with an upper electrode then formed on the upper unreactive film. In the Technical Digest of the 1994 International Electron Devices Meeting, pp. 831-834, it is disclosed that a polycrystalline $RuO_2$ thin film is deposited by a reactive sputtering method on a TiN thin film serving as a diffusion barrier layer and the laminate of the TiN thin film and the polycrystalline $RuO_2$ thin film is subsequently patterned to define a composite $RuO_2$/TiN storage electrode before a $SrTiO_3$ thin dielectric film is deposited on the $RuO_2$/TiN. The $SrTiO_3$ thin dielectric film is selected for its good chemical and thermal stability and good insulating properties and the purpose of the paraelectric $SrTiO_3$ thin dielectric film is to provide the insulating dielectric layer for a DRAM capacitor. The insulating $SrTiO_3$ thin dielectric film is not thin enough to pass a current and is not in direct contact with a semiconductor.

Generally, the instant invention uses a thin, unreactive, and conductive film to contact the thin I-Layer material in an MIS contact structure. The thin, unreactive film may be a conductive oxide such as $RuO_2$ (others include: (Nb,Sr)$TiO_3$, (Ba,Sr)$TiO_3$, $SrRuO_3$, $MoO_2$, $OsO_2$, $WO_2$, $RhO_2$, $IrO_2$, $ReO_3$, $ReO_2$, $LaCuO_3$, $Ti_2O_3$, TiO, $V_2O_3$, VO, $Fe_3O_4$, ZnO, InSnO or $CrO_2$). In addition to highly conductive tungsten(IV) oxide, also known as tungsten dioxide, $WO_2$, there are other intermediate oxides of tungsten including $W_{18}O_{49}$, $W_{20}O_{58}$, and $W_{24}O_{70}$ that may for example be formed by reacting tungsten metal and tungsten trioxide.

The thin, unreactive film is generally less than 10 nm thick, preferably less than 5 nm thick, and most preferably between 0.5 nm and 3.0 nm thick. As used herein, the term "unreactive", when used in reference to a material contacting an I-Layer material, means a material that provides a thermally stable conductive interface to the I-Layer material during and after processing (e.g., to temperatures in the range of approximately 350° C. or 450° C. in a forming gas or similar gas for on the order of approximately 2 hr.). Note that when a conductive metal oxide such as $RuO_2$ is used for the thin, unreactive, and conductive film, that layer can also contain some amount of unoxidized or partially oxidized metal, for example Ru. For example, a thin, unreactive film of $RuO_2$ which is chemically changed by becoming partially reduced during the deposition process of the complete metal stack and ensuing thermal cycles is still considered unreactive since it still provides a stable conductive interface to the I-Layer material. The I-Layer may be on the order of 0.2 nm-10 nm, or more preferably 0.2 nm-5 nm, or still more preferably, 0.2 nm-1.0 nm.

Figure 1:
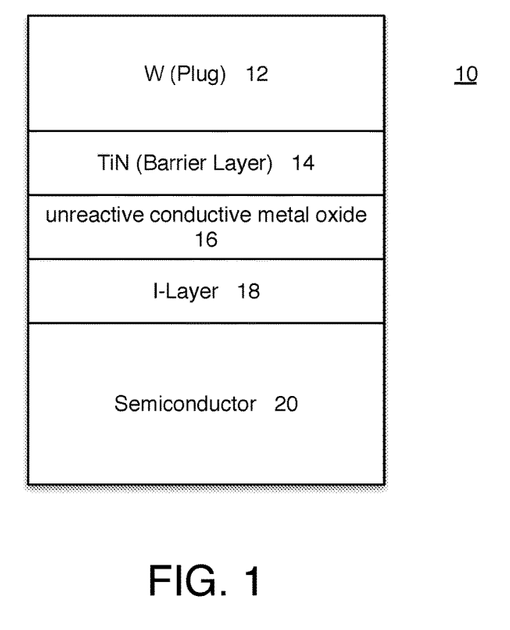
FIG. 1 illustrates an example of an MIS contact structure according to an embodiment of the present invention.

When the instant invention is applied to the fabrication of MIS contacts in integrated circuits, it is understood that several different metal layers constitute an interconnect system that is key to the operation of the integrated circuit. Typically, multiple highly conductive metal interconnect layers, often as many as ten or more, are used to form the complex interconnections between devices and these layers are most commonly copper surrounded (clad) by a barrier metal such as tantalum nitride (TaN). The multiple TaN-clad copper layers are separated by inter-layer dielectric (ILD) layers, with the ILD material being a reliable insulator such as silicon dioxide. The connection between the lowest copper interconnect layer and the MIS contact is typically by way of a tungsten plug formed in a contact via. To provide good adhesion of the W plug to the via, the via is typically first lined with a deposited thin layer of "adhesion" and/or "barrier" metal before the W is deposited. The adhesion or barrier metal is typically titanium nitride (TiN) or a Ti/TiN thin laminate. Referring to FIG. 1, the structure of an MIS contact 10 according to an embodiment of the instant invention thus includes, in sequence, a W plug 12 and a TiN barrier/adhesion layer 14, an unreactive, conductive metal oxide 16 (such as $RuO_2$), and an I-Layer 18 (such as $TiO_2$, $TiSi_xO_y$, or $TiO_2/SiO_2$), with the I-Layer 18 being in contact with the semiconductor 20. The semiconductor 20 is typically silicon, germanium, silicon germanium alloy, germanium tin alloy, or silicon germanium tin alloy but may also be a compound semiconductor such as SiC, GaN, InGaN, GaAs, InAs, InGaAs alloy, GaSb or InSb, terniary or quarterniary compound semiconductors, or a two-dimensional semiconductor such as graphene, silicene, germanene, phosphorene, monolayer molybdenum disulfide, or carbon nanotubes.

Figure 2:
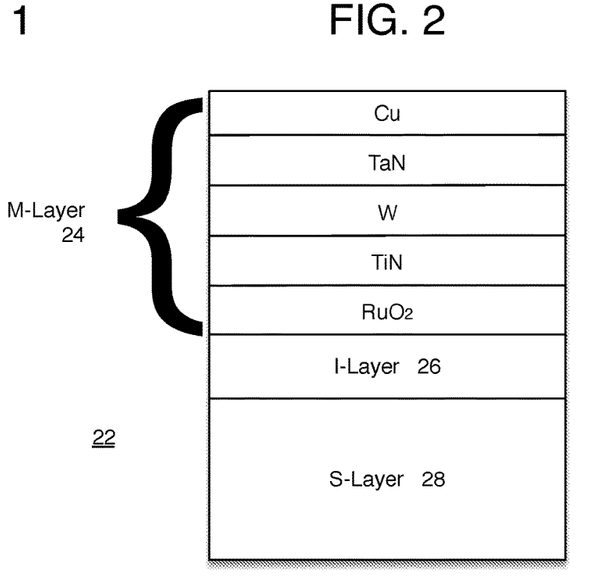
FIG. 2 illustrates a further example of an MIS contact structure according to an embodiment of the present invention.

With reference to FIG. 2, the component parts of an MIS structure 22 according to an embodiment of the instant invention may therefore be described as follows: The M-Layer 24 is a stack of metals such as Cu/TaN/W/TiN/RuO2. The I-Layer 26 comprises one or more oxides, an oxide of titanium $TiO_x$ and/or an oxide of silicon $SiO_x$ (such as $TiO_2$ or $TiSi_xO_y$ or $TiO_2/SiO_2$), that would be considered insulator(s) or semiconductor(s) in bulk form but are conductive when made extremely thin. The S-Layer 28 is a semiconductor such as silicon or germanium or silicon germanium alloy. An innovative aspect of the invention is that the metal at the bottom of the metal stack i.e., the metal that is adjacent to and in direct contact with the I-Layer is a metal oxide that is electrically conductive, chemically stable, and unreactive at its interface with the I-Layer at temperatures up to 450° C. The disclosed MIS structure also has the property that the contact resistivity for the contact structure is lower than approximately $10^{-5}$-$10^{-7}$ $\Omega \cdot cm^2$, and preferably lower than approximately $10^{-8}$ $\Omega \cdot cm^2$.

Figure 3A:
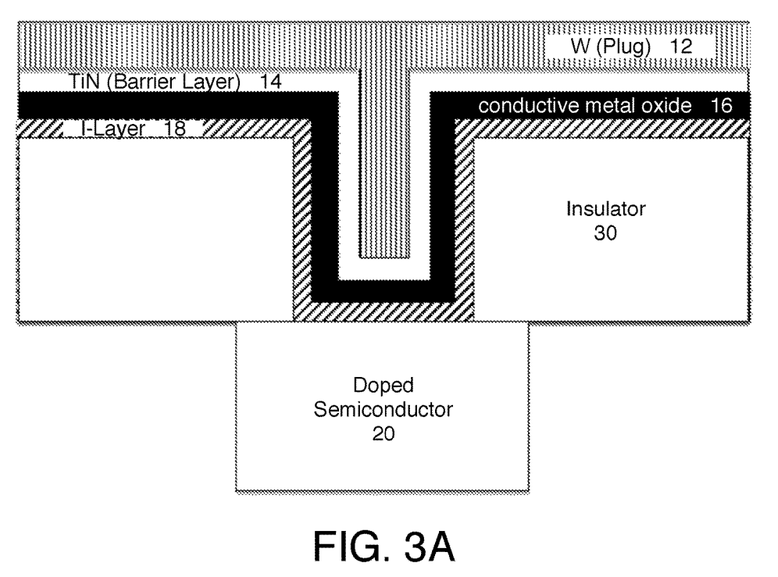
FIGS. 3A, 3B, and 3C illustrate examples of structures created during fabrication of an MIS contact structure according to an embodiment of the present invention.
Figure 3B:
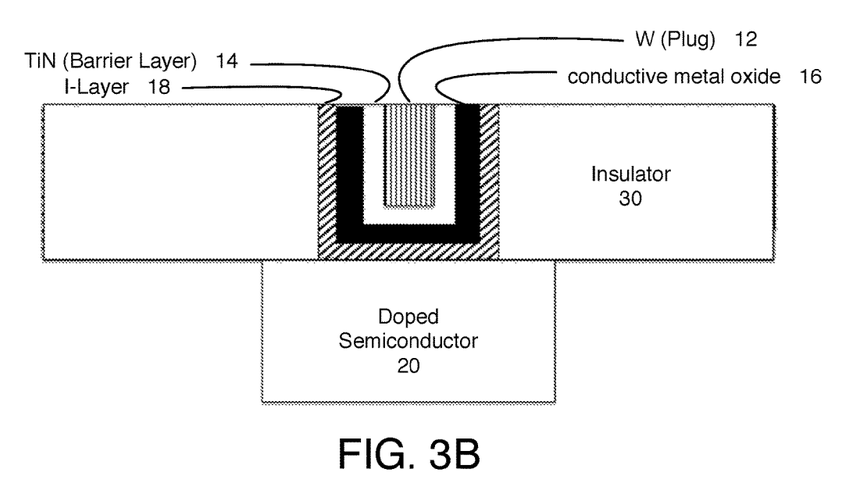

In one embodiment of the invention, illustrated in FIG. 3A, after forming a highly n-type doped region of semiconductor 20, which may for example be a source or drain region of a field effect transistor, the region is covered by a deposited layer of insulating material 30, which may be an oxide of silicon. Subsequently, a contact window, or via, is defined (e.g., by photolithographic or other means) and a hole is etched through the insulating layer to expose a surface of the n-type doped semiconductor region. The exposed surface of the n-type doped semiconductor region is cleaned, for example by a short exposure to hydrofluoric acid diluted in water, and then a first layer of a metal oxide (I-Layer, 18) is formed on the exposed surface. Thereafter a different metal oxide layer 16 that is electrically conductive is deposited over the first metal oxide layer 18. Subsequently, a layer of an adhesion or barrier metal 14 is deposited and the contact hole is then filled with a different bulk metal to form a metal plug 12. If any of the processes used to form the conductive material layers is not selective, those conductive material layers will be deposited on all surfaces including on top of the insulating material 30 as well as within the contact hole as illustrated in FIG. 3A. In such a case, those conductive material layers that are not deposited selectively within the contact hole are subsequently removed from atop the insulating layer, for example by chemical-mechanical polishing (CMP), leaving the conductive materials substantially filling the contact hole to form an MIS contact contained within the contact hole, as shown in FIG. 3B. Subsequently, multiple layers of metal interconnect separated by insulating material may be deposited and patterned and the whole assembly may be annealed at temperatures in excess of 300° C., and even at 400° C. or higher, to improve the functional properties or the reliability of the integrated circuit. Annealing may be in an atmosphere of hydrogen and nitrogen gas (so-called forming gas) or inert gas, and accumulated annealing time may be tens of minutes and as much as two hours.

Figure 3C:
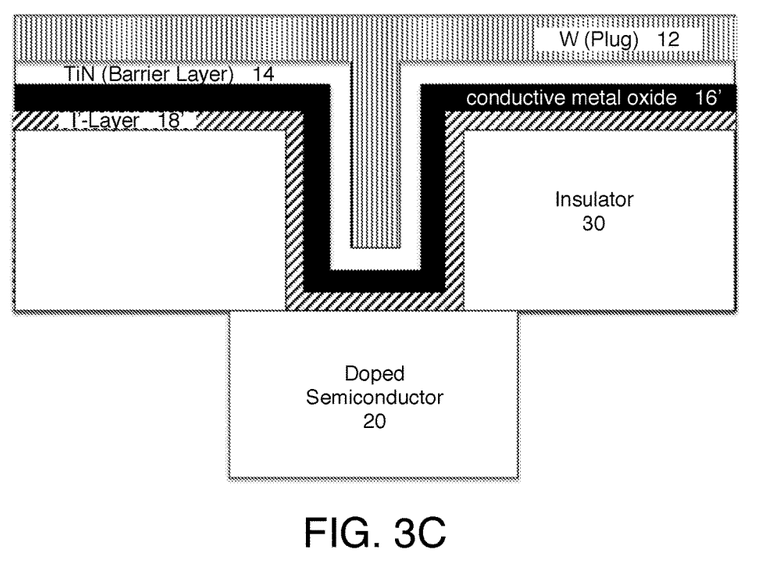

In another embodiment of the invention, illustrated in FIG. 3C, after forming a highly n-type doped region of semiconductor 20, which may for example be a source or drain region of a field effect transistor, the region is covered by a deposited layer of insulating material 30, which may be an oxide of silicon. Subsequently, a contact window, or via, is defined (e.g., by photolithographic or other means) and a hole or trench is etched through the insulating layer to expose a surface of the n-type doped semiconductor region. The exposed surface of the n-type doped semiconductor region is cleaned, for example by a short exposure to hydrofluoric acid diluted in water, and then a first layer of a metal oxide (I'-Layer, 18') is formed on the exposed surface. Thereafter a different metal oxide layer 16' that is electrically conductive is deposited over the first metal oxide layer 18'. A layer of tungsten 14 is deposited by metalorganic chemical vapor deposition or atomic layer deposition and the contact hole is then filled with tungsten to form a tungsten plug 12. If any of the processes used to form the conductive material layers is not selective, those conductive material layers will be deposited on all surfaces including on top of the insulating material 30 as well as within the contact hole as illustrated in FIG. 3A. In such a case, those conductive material layers that are not deposited selectively within the contact hole are subsequently removed from atop the insulating layer, for example by chemical-mechanical polishing (CMP), leaving the conductive materials substantially filling the contact hole to form an MIS contact contained within the contact hole, as shown in FIG. 3B. Subsequently, multiple layers of metal interconnect separated by insulating material may be deposited and patterned and the whole assembly may be annealed at temperatures in excess of 300° C., and even at 400° C. or higher, to improve the functional properties or the reliability of the integrated circuit. Annealing may be in an atmosphere of hydrogen and nitrogen gas (so-called forming gas) or inert gas, and accumulated annealing time may be tens of minutes and as much as two hours.

In alternative embodiments, the process of forming the contact hole may expose more than one n-type doped region of semiconductor. The same process may expose at least one region of p-type doped semiconductor in addition to the at least one n-type doped region of semiconductor. The n-type doped region(s) of semiconductor may be silicon regions or silicon-carbon alloy regions or silicon-phosphorus alloy regions or other semiconductor regions. The p-type doped region(s) of semiconductor may be silicon regions or silicon-germanium alloy regions or germanium regions or other semiconductor regions.

In one embodiment of the invention, the n-type doped region of semiconductor is a silicon (Si) source or drain region of a field effect transistor, where the silicon is very heavily doped with phosphorus (P) to a concentration in excess of $10^{20}$ cm$^{-3}$ (which may be denoted as a silicon-phosphorus alloy, Si:P) the first metal oxide layer is titanium dioxide ($TiO_2$) and it is deposited by atomic layer deposition (ALD) to a thickness of between 0.2 nm and 3.0 nm, and the second metal oxide layer is conductive ruthenium oxide ($RuO_2$) deposited by ALD to a thickness of between 1.0 nm and 5.0 nm. The adhesion or barrier metal is titanium nitride (TiN), deposited by ALD to a thickness of between 1.0 nm and 5.0 nm, and the bulk metal that forms a metal plug is tungsten (W), deposited by chemical vapor deposition (CVD).

In another embodiment of the invention, the n-type doped region of semiconductor is a silicon (Si) source or drain region of a field effect transistor, where the silicon is very heavily doped with phosphorus (P), for example to a concentration in excess of $10^{20}$ cm$^{-3}$ (which may be denoted as a silicon-phosphorus alloy, Si:P) the first metal oxide layer (I-layer) is tungsten trioxide ($WO_3$) with a thickness of between 0.2 nm and 3.0 nm, and the second metal oxide layer (M-layer) is conductive tungsten oxide (e.g., $WO_2$ or a conductive tungsten oxide with stoichiometry between $WO_2$ and $WO_3$ such as $W_{18}O_{49}$) with a thickness of between 0.5 nm and 5.0 nm. The adhesion or barrier metal is tungsten (W), deposited by metalorganic chemical vapor deposition or atomic layer deposition to a thickness of between 0.5 nm and 5.0 nm, and the bulk metal that forms a metal plug is also tungsten (W), deposited by chemical vapor deposition (CVD) or physical vapor deposition (PVD). The first metal oxide ($WO_3$) is deposited by atomic layer deposition (ALD) or is formed by deposition of a thin layer of tungsten metal that is subsequently oxidized. The conductive tungsten oxide (e.g. $W_{18}O_{49}$ or $WO_2$) is deposited by ALD or CVD or is formed by reaction of tungsten metal with the $WO_3$ I-layer to form a conductive tungsten oxide layer on top of some remaining thickness of the $WO_3$ I-layer. The conductive tungsten oxide may have a composition intermediate between $WO_2$ and $WO_3$ (including one or a mixture of $WO_2$, $W_{18}O_{49}$, $W_{20}O_{58}$, $W_{24}O_{70}$) and the composition may vary in this range through the depth of the conductive tungsten oxide layer. Reaction of W with $WO_3$ forms a sub-stoichiometric tungsten oxide layer of composition ranging between $WO_2$ and $WO_3$ (including one or a mixture of $WO_2$, $W_{18}O_{49}$, $W_{20}O_{58}$, $W_{24}O_{70}$). Furthermore, one or a few atomic monolayers of silicon oxide may exist at the silicon interface between the $WO_3$ and the silicon. The metal that forms a metal plug may alternately be a low resistance metal, for example copper or silver.

In another embodiment of the invention, the n-type doped region of semiconductor is a silicon (Si) source or drain region of a field effect transistor, where the silicon is very heavily doped with a donor such as phosphorus (P), for example to a concentration in excess of $10^{20}$ cm$^{-3}$, the first metal oxide layer (I-layer) is $V_2O_5$ with a thickness of between 0.2 nm and 3.0 nm, and the second metal oxide layer (M-layer) is conductive vanadium oxide (e.g., $V_2O_3$) with a thickness of between 0.5 nm and 5.0 nm. The adhesion or barrier metal layer comprises tungsten (W) or vanadium (V) or a mixture of W and V, deposited by metalorganic chemical vapor deposition or atomic layer deposition to a thickness of between 0.5 nm and 5.0 nm. The first metal oxide ($V_2O_5$) is deposited by atomic layer deposition (ALD) or is formed by deposition of a thin layer of vanadium metal that is subsequently oxidized. The conductive vanadium oxide (e.g. $V_2O_3$) is deposited by ALD or CVD or is formed by reaction of vanadium metal with the $V_2O_5$ I-layer. The conductive vanadium oxide may have a composition intermediate between VO and $VO_2$ and the composition may vary in this range through the depth of the conductive vanadium oxide layer. Reaction of V from the adhesion or barrier metal layer with $V_2O_5$ forms a vanadium oxide layer of composition ranging between VO and $VO_2$ on top of some remaining thickness of the $V_2O_5$ I-layer. Furthermore, one or a few atomic monolayers of silicon oxide may exist at the silicon interface between the $V_2O_5$ and the silicon. The metal that forms a metal plug may alternately be a low resistance metal, for example copper or silver.

In another embodiment of the invention, the n-type doped region of semiconductor is a silicon (Si) source or drain region of a field effect transistor, where the silicon is very heavily doped with a donor such as phosphorus (P), for example to a concentration in excess of $10^{20}$ cm$^{-3}$, the first metal oxide layer (I-layer) is $TiO_2$ with a thickness of between 0.2 nm and 3.0 nm, and the second metal oxide layer (M-layer) is conductive tungsten oxide (e.g., $WO_2$) with a thickness of between 0.5 nm and 5.0 nm. The adhesion or barrier metal layer comprises tungsten (W), deposited by metalorganic chemical vapor deposition or atomic layer deposition to a thickness of between 0.5 nm and 5.0 nm. The first metal oxide ($TiO_2$) is deposited by atomic layer deposition (ALD) or is formed by deposition of a thin layer of titanium metal that is subsequently oxidized. The conductive tungsten oxide (e.g. $WO_2$) is deposited by ALD or CVD or is formed by reaction of tungsten metal from the adhesion or barrier metal layer with the $TiO_2$ I-layer. The conductive tungsten oxide may have a composition intermediate between $WO_2$ and $WO_{2.95}$ and the composition may vary in this range through the depth of the conductive tungsten oxide layer. Reaction of W from the adhesion or barrier metal layer with $TiO_2$ forms a conductive mixed oxide layer comprising a mixture of tungsten and titanium oxides on top of some remaining thickness of the $TiO_2$ I-layer. Furthermore, one or a few atomic monolayers of silicon oxide may exist at the silicon interface between the $TiO_2$ and the silicon.

In other embodiments of the invention, the first metal oxide layer (I-Layer) may comprise any one of or a combination of $WO_3$, $TiO_2$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $GaO$, $SrTiO_3$ or $(Ba,Sr)TiO_3$, silicon oxide or germanium oxide or doped or non-stochiometric insulating variants thereof. Moreover the first metal oxide may alternatively be deposited by atomic layer deposition (ALD), plasma-enhanced ALD, chemical vapor deposition (CVD), plasma-enhanced CVD, atomic vapor deposition, oxidation of a deposited thin film of the metal, laser ablation, physical vapor deposition, or by reaction of a metal with a thin layer of an oxide of the n-type doped region of semiconductor. The first metal oxide may be a mixed oxide, comprising the oxides of two different metals (such as hafnium zirconium oxide, $Hf_xZr_{1-x}O_2$) or comprising the oxides of a metal and a semiconductor such as silicon or germanium, such as titanium silicate, $TiSi_xO_y$ or a mixed metal/semiconductor oxide with some amount of nitrogen (i.e. a metal silicon oxynitride such as titanium silicon oxynitride).

In still further embodiments of the invention, the second metal oxide that is electrically conductive (M-layer) may comprise any one of or a combination of $SrRuO_3$, a conductive oxide of tungsten (e.g., $WO_2$, $W_2O_5$, or a mixture of tungsten oxides with compositions ranging between $WO_2$ and $WO_{2.95}$ including one or a mixture of $WO_2$, $W_{18}O_{49}$, $W_{20}O_{58}$, $W_{24}O_{70}$, $W_{25}O_{73}$, $W_{40}O_{118}$), $LaCuO_3$, $Fe_3O_4$, $LaSrCoO_3$, conducting $ZnO$, and $CrO_2$, or an oxide of ruthenium (RuOx) or iridium (IrOx), a dioxide of ruthenium ($RuO_2$), rhodium ($RhO_2$), palladium, osmium ($OsO_2$), or iridium ($IrO_2$), or a conductive oxide of rhenium ($ReO_2$ or $ReO_3$), titanium ($Ti_2O_3$ or $TiO$) or vanadium ($V_2O_3$ or $VO$) or indium tin oxide (ITO) or aluminum-doped zinc-oxide (AZO) or doped or non-stochiometric conducting variants thereof. The second metal oxide may alternatively be deposited by reactive sputtering (of the metal in a plasma comprising oxygen), ALD, CVD, laser ablation, cyclic voltametric deposition, anodic deposition, electrophoretic deposition, oxidation of a thin film of the metal, or any of the other means discussed above.

As noted above, although examples of metal oxides that may comprise the interface layer are specified herein, persons of ordinary skill in the art will appreciate that such metal oxides may not have the precise stoichiometry of the examples. For instance, TiO2 may more preferably be described as TiOx, with x less than or equal to 2 but greater then 1.5. Similar stoichiometries of others of the metal oxides described herein should be understood to be within the scope of the present invention. Furthermore persons of ordinary skill in the art will appreciate that such metal oxides may include some amount of nitrogen, the amount of nitrogen being less than the amount of oxygen.

In other embodiments the adhesion or barrier metal may be tantalum nitride or ruthenium oxide or tungsten or CoWP. The adhesion or barrier metal may be deposited by atomic layer deposition or chemical vapor deposition (CVD) or metal organic chemical vapor deposition (MOCVD) or physical vapor deposition (PVD). The bulk metal that forms a metal plug may be cobalt or copper or aluminum or silver or a plurality of carbon nanotubes. The metal that forms a metal plug may alternatively be deposited by CVD, PVD, sputtering or electrochemical deposition.

A similar process may be applied to form MIS contacts to p-type doped regions of semiconductor material.

In various embodiments, the layers described herein may be deposited in a single process chamber (in sequential processing steps), in different chambers of a multi-chamber processing tool, or in separate processing tools.

Thus, described herein is an electrical contact structure including a conductor; a semiconductor (e.g., a III-V compound semiconductors or a semiconductor comprising one or several of the group IV elements silicon, germanium, carbon, or tin); and an interfacial dielectric layer of less than 4 nm thickness disposed between and in contact with both the conductor and the semiconductor, wherein the conductor is a conductive metal oxide, and wherein the interfacial dielectric layer is an oxide of a metal or an oxide of a semiconductor or an oxide of multiple different metals or metal(s) and semiconductor(s). In various embodiments, the electrical contact structure has a specific contact resistivity of less than or equal to approximately $10^{-5}$-$10^{-7}$ $\Omega$-$cm^2$ when the doping in the semiconductor adjacent the MIS contact is greater than approximately $2\times10^{19}$ $cm^{-3}$ and less than approximately $1\times10^{-8}$ $\Omega$-$cm^2$ when the doping in the semiconductor adjacent the MIS contact is greater than approximately $10^{20}$ $cm^{-3}$. Alternatively, or in addition, the interface layer is a material that would be an insulator or a wide band gap semiconductor in its bulk state. In some embodiments, the interfacial dielectric layer has a thickness in the range 0.2 nm to 10 nm, preferably 0.2 nm to 4 nm, and may be one of: $WO_3$, $TiO_2$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $GaO$, $SrTiO_3$ or $(Ba,Sr)TiO_3$, silicon oxide or germanium oxide. The conductive metal oxide layer may have a thickness in the range 0.5 nm to 3 nm (although in other embodiments different thicknesses may be used) and may be one of: $WO_2$ (or a mixture of tungsten oxides with compositions ranging between $WO_2$ and $WO_{2.95}$ including one or a mixture of $WO_2$, $W_{18}O_{49}$, $W_{20}O_{58}$, $W_{24}O_{70}$, $W_{25}O_{73}$, $W_{40}O_{118}$), $(Nb,Sr)TiO_3$, $(Ba,Sr)TiO_3$, $SrRuO_3$, $MoO_2$, $OsO_2$, $WO_2$, $RhO_2$, $RuO_2$, $IrO_2$, $ReO_3$, $ReO_2$, $LaCuO_3$, $Ti_2O_3$, $TiO$, $V_2O_3$, $VO$, $Fe_3O_4$, zinc oxide (ZnO), indium tin oxide (ITO), aluminum-doped zinc-oxide (AZO), InSnO or $CrO_2$. In some embodiments, the interfacial dielectric layer includes a separation layer (e.g., a further insulating oxide layer separating the conductor and the semiconductor). Preferably, the junction between the conductive metal oxide layer and the interfacial dielectric layer is chemically stable up to a temperature of 400° C. and more preferably chemically stable up to a temperature of 450° C. For example, there is preferably no chemical reaction between the conductive metal oxide layer and the interfacial dielectric layer that substantially consumes the interfacial dielectric up to a temperature of 450° C. Also, or alternatively, the contact resistivity of the device is preferably less than or equal to approximately $10^{-7}$ $\Omega$-$cm^2$ after the device is heated to a temperature of 400° C. More preferably, the contact resistivity of the device remains less than or equal to approximately $10^{-7}$ $\Omega$-$cm^2$ after the device is heated to a temperature of 450° C. In some embodiments, the conductive metal oxide layer of the electrical contact structure is contacted by a thin metal layer of a different metal.

What is claimed is:

1. An electrical contact structure, comprising a conductor; a semiconductor layer; and an interfacial dielectric layer of less than 4 nm thickness disposed between and in contact with both the conductor and the semiconductor layer, wherein the conductor is a conductive metal oxide and the interfacial dielectric layer comprises an oxide of a metal or an oxide of a semiconductor, and the electrical contact structure has a specific contact resistivity of less than or equal to approximately $10^{-5}$-$10^{-7}$ $\Omega$-cm$^2$.

2. The electrical contact structure of claim 1 wherein the interfacial dielectric layer comprises a material that would be an insulator or a semiconductor in its bulk state.

3. The electrical contact structure of claim 1 wherein the interfacial dielectric layer has a thickness in the range 0.2 nm to 4 nm and the conductive metal oxide layer has a thickness in the range 0.5 nm to 3 nm.

4. The electrical contact structure of claim 1 wherein the interfacial dielectric layer further includes a separation layer.

5. The electrical contact structure of claim 1 wherein the junction between the conductive metal oxide layer and the interfacial dielectric layer is chemically stable up to a temperature of 400° C.

6. The electrical contact structure of claim 1 wherein the junction between the conductive metal oxide layer and the interfacial dielectric layer is chemically stable up to a temperature of 450° C.

7. The electrical contact structure of claim 1 wherein there is no chemical reaction between the conductive metal oxide layer and the interfacial dielectric layer that substantially consumes the interfacial dielectric up to a temperature of 450° C.

8. The electrical contact structure of claim 1 wherein the contact resistivity of the electrical contact structure remains less than or equal to approximately $10^{-5}$-$10^{-7}$ $\Omega$-cm$^2$ after the structure is heated to a temperature of 400° C.

9. The electrical contact structure of claim 8 wherein the semiconductor layer is a doped semiconductor with a doping larger than $10^{19}$ cm$^{-3}$.

10. The electrical contact structure of claim 1 wherein the contact resistivity of the electrical contact structure remains less than or equal to approximately $10^{-5}$-$10^{-7}$ $\Omega$-cm$^2$ after the structure is heated to a temperature of 450° C.

11. The electrical contact structure of claim 1 wherein the semiconductor layer adjacent the interfacial dielectric layer is doped n-type to an active concentration greater than approximately $10^{20}$ cm$^{-3}$ and the electrical contact structure has a specific contact resistivity of less than approximately $1\times10^{-8}$ $\Omega$-cm$^2$.

12. The electrical contact structure of claim 1 wherein the conductive metal oxide layer is contacted by a thin metal layer of a metal different than that of the conductive metal oxide layer.

13. The electrical contact structure of claim 1 wherein the conductive metal oxide layer is one of $WO_2$ or a mixture of tungsten oxides with compositions ranging between $WO_2$ and $WO_{2.95}$, $(Nb,Sr)TiO_3$, $(Ba,Sr)TiO_3$, $SrRuO_3$, $MoO_2$, $OsO_2$, $RhO_2$, $RuO_2$, $IrO_2$, $ReO_3$, $ReO_2$, $LaCuO_3$, $Ti_2O_3$, $TiO$, $V_2O_3$, $VO$, $Fe_3O_4$, $ZnO$, $InSnO$, $ITO$, $AZO$, and $CrO_2$, or any of their doped or non-stochiometric variants.

14. The electrical contact structure of claim 1 wherein the interfacial dielectric layer comprises at least one of $WO_3$, $TiO_2$, $SrTiO_3$, $MgO$, $Al_2O_3$, $HfO_2$, $ZrO_2$, $Ta_2O_5$, $V_2O_5$, $BaZrO_3$, $La_2O_3$, $Y_2O_3$, $HfSiO_4$, $ZrSiO_4$, $CoO$, $NiO$, $ZnO$, $GaO$, $SiO_2$, $SrTiO_3$, $(Ba,Sr)TiO_3$, $ZnO$, silicon oxide, and germanium oxide, or any of their doped or non-stochiometric variants.

15. The electrical contact structure of claim 1 wherein the semiconductor layer comprises a semiconductor including one or more of the group IV elements silicon, germanium, carbon, or tin, or carbon nanotubes.

16. The electrical contact structure of claim 1 wherein the interfacial dielectric layer comprises at least one of titanium silicate, $TiSi_xO_y$, or titanium silicon oxynitride.

17. The electrical contact structure of claim 1 wherein the interfacial dielectric layer comprises an oxide of titanium and the conductive metal oxide layer comprises an oxide of ruthenium.

18. The electrical contact structure of claim 17 wherein the interfacial dielectric layer comprises $TiO_2$ and the conductive metal oxide layer comprises $RuO_2$.

19. The electrical contact structure of claim 1 wherein the interfacial dielectric layer has a thickness in the range 0.2 nm to 10 nm.

* * * * *